US012581702B2

(12) United States Patent
Fan et al.

(10) Patent No.: US 12,581,702 B2
(45) Date of Patent: Mar. 17, 2026

(54) COMMON SELF ALIGNED GATE CONTACT FOR STACKED TRANSISTOR STRUCTURES

(71) Applicant: INTERNATIONAL BUSINESS MACHINES CORPORATION, Armonk, NY (US)

(72) Inventors: Su Chen Fan, Cohoes, NY (US); Stuart Sieg, Albany, NY (US); Xuan Liu, Clifton Park, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 753 days.

(21) Appl. No.: 17/808,566

(22) Filed: Jun. 24, 2022

(65) Prior Publication Data

US 2023/0420503 A1 Dec. 28, 2023

(51) Int. Cl.
| | |
|---|---|
| *H10D 62/10* | (2025.01) |
| *H10D 30/43* | (2025.01) |
| *H10D 30/62* | (2025.01) |
| *H10D 30/67* | (2025.01) |

(52) U.S. Cl.
CPC ........... *H10D 62/121* (2025.01); *H10D 30/43* (2025.01); *H10D 30/6211* (2025.01); *H10D 30/6735* (2025.01)

(58) Field of Classification Search
CPC .. H10D 62/121; H10D 30/43; H10D 30/6211; H10D 30/6735
See application file for complete search history.

(56) References Cited

U.S. PATENT DOCUMENTS

| | | | |
|---|---|---|---|
| 8,541,819 B1 | 9/2013 | Or-Bach | |
| 9,461,143 B2 | 10/2016 | Pethe | |
| 9,640,531 B1 | 5/2017 | Or-Bach | |
| 10,217,674 B1 * | 2/2019 | Hook | H01L 24/32 |
| 10,297,569 B2 | 5/2019 | Edelstein | |
| 10,797,139 B2 | 10/2020 | Morrow | |
| 2020/0006330 A1 | 1/2020 | Lilak | |
| 2020/0098921 A1 | 3/2020 | Rachmady | |
| 2020/0105672 A1 | 4/2020 | Madhavan | |

FOREIGN PATENT DOCUMENTS

EP 2562802 B1 1/2020

* cited by examiner

*Primary Examiner* — Jay C Kim
*Assistant Examiner* — Woo K Lee
(74) *Attorney, Agent, or Firm* — L. Jeffrey Kelly

(57) ABSTRACT

A stacked semiconductor structure including a top transistor stacked above a bottom transistor, and a single gate contact in electrical contact with a top gate conductor of the top transistor and a bottom gate conductor of the bottom transistor.

20 Claims, 6 Drawing Sheets

SECTION Y-Y

CHANNEL
REGION

GATE REGION

SECTION Y-Y

SECTION Y-Y

*SECTION Y-Y*

*SECTION Y-Y*

SECTION Y-Y

SECTION Y-Y

200

114
126        X
128        116 128 126

128

218

110

106

208

102
104

206

204

202

Z

Y

*SECTION Y-Y*

*SECTION X-X*

COMMON SELF ALIGNED GATE CONTACT FOR STACKED TRANSISTOR STRUCTURES

BACKGROUND

The present invention generally relates to semiconductor structures, and more particularly to stacked transistor structures having a common self-aligned gate contact.

Integrated circuit (IC) chips are formed on semiconductor wafers at increasingly smaller scale. In current technology nodes, such as 7, 10 and 14 nanometer technologies, transistor devices are constructed as three-dimensional (3D) fin field effect transistor (FINFET) structures. However, chipmakers face a myriad of challenges at 5 nm, 3 nm and beyond. Currently, traditional chip scaling continues to slow as process complexities and costs escalate at each node.

A potential solution to this chip scaling problem is gate-all-around technology. One example of a complex gate-all-around technology is a complementary FET (CFET) where multiple transistors are vertically stacked on top of each other.

SUMMARY

According to an embodiment of the present invention, a semiconductor structure is provided. The semiconductor structure may include a top transistor stacked above a bottom transistor, and a single gate contact in electrical contact with a top gate conductor of the top transistor and a bottom gate conductor of the bottom transistor.

According to another embodiment of the present invention, a semiconductor structure is provided. The semiconductor structure may include a top transistor stacked above a bottom transistor, and a single gate contact in electrical contact with a top gate conductor of the top transistor and a bottom gate conductor of the bottom transistor, where the single gate contact is self-aligned to the top gate conductor.

According to another embodiment of the present invention, a semiconductor structure is provided. The semiconductor structure may include a top transistor stacked above a bottom transistor, and a single gate contact in electrical contact with a top gate conductor of the top transistor and a bottom gate conductor of the bottom transistor, where the top gate conductor and the single gate contact include the same conductive material.

BRIEF DESCRIPTION OF THE DRAWINGS

The following detailed description, given by way of example and not intended to limit the invention solely thereto, will best be appreciated in conjunction with the accompanying drawings, in which.

Figure 1:
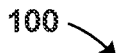
FIG. 1, a top view of a generic structure is shown to provide spatial context to the different cross-sectional views and structural orientations of the semiconductor structures shown in the subsequent figures.
Figure 1:
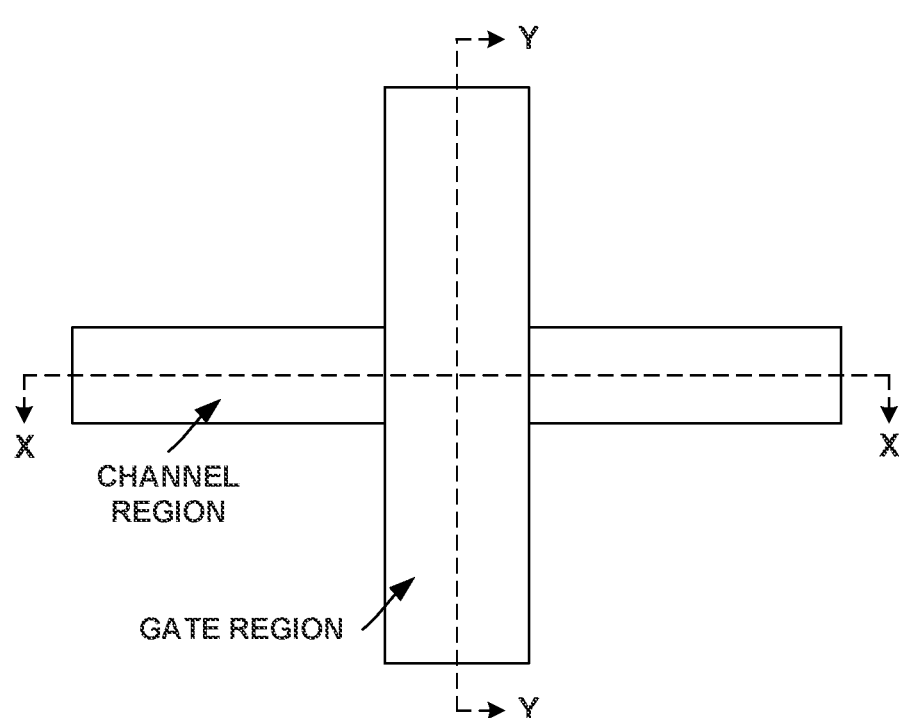
Figure 1:
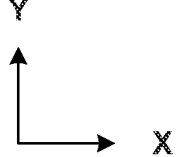

The drawings are not necessarily to scale. The drawings are merely schematic representations, not intended to portray specific parameters of the invention. For clarity and ease of illustration, scale of elements may be exaggerated. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also, the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Complementary field effect transistors, or stacked transistors, have known advantages over conventional transistor structures in terms of density, performance, power consumption, and integration. However, fabricating stacked transistor devices with a common gate contact presents unique challenges. For example, current designs include wiring separate gate contacts together in a separate wiring level using a strap, however, doing so requires additional steps and results in higher resistance. Additionally, there is a high potential for misalignment when attempting to form a common contact for two gate conductors of two stacked devices.

The present invention generally relates to semiconductor structures, and more particularly to stacked transistor structures having a common self-aligned gate contact. More specifically, the stacked transistor structures and associated method disclosed herein enable a novel solution for providing a common self-aligned gate contact. Exemplary embodiments of a stacked transistor structure having a common self-aligned gate contact are described in detail below by referring to the accompanying drawings in FIGS. 1 to 9. Those skilled in the art will readily appreciate that the detailed description given herein with respect to these figures is for explanatory purposes as the invention extends beyond these limited embodiments.

Referring now to FIG. 1, a top view of a generic structure is shown to provide spatial context to the different cross-sectional views and structural orientations of the semiconductor structures shown in the figures and described below. Additionally, XYZ Cartesian coordinates may be also shown in each of the drawings to provide additional spatial context. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

The generic structure illustrated in FIG. 1 shows a channel region, and a gate region situated perpendicular to the channel region. FIGS. 1-9 represent cross section views oriented as indicated in FIG. 1.

Figure 2:
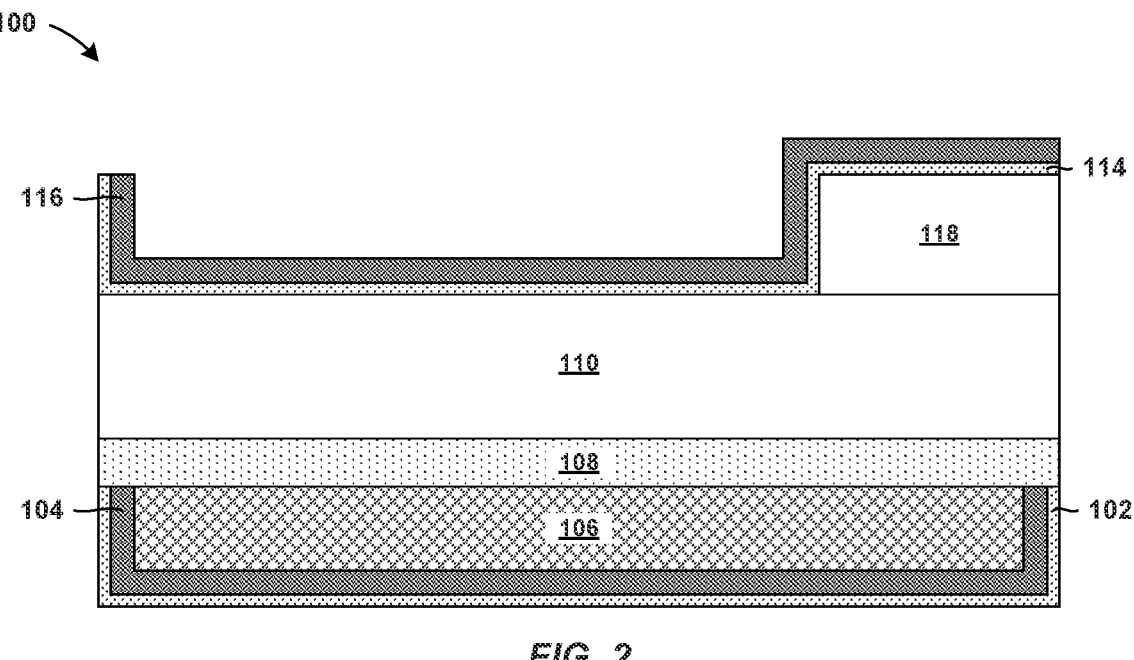
FIG. 2 is a cross-sectional view of a semiconductor structure during an intermediate step of a method of fabricating a stacked transistor structure according to an exemplary embodiment.

Referring now to FIG. 2, a structure 100 is shown during an intermediate step of a method of fabricating a stacked transistor structure according to an embodiment of the invention. FIG. 2 depicts a cross-sectional view of the generic structure shown in FIG. 1 taken along line Y-Y.

The structure 100 illustrated in FIG. 2 includes a bottom transistor structure including a bottom gate dielectric layer 102, a bottom work function metal layer 104 (hereinafter "bottom WFM 104), and a bottom gate conductor 106. After forming the bottom transistor, specifically, after replacement metal gate operations, a middle-of-line dielectric layer 108 (hereinafter (MOL dielectric 108) and a bonding oxide layer 110 are formed according to known techniques.

Next, A top transistor structure is then formed over the bottom transistor structure using a conventional dielectric-to-dielectric bonding process, e.g. oxide to oxide bonding. For example, a first oxide layer can be blanket deposited over the bottom transistor structure, and second oxide layer can be deposited over a $2^{nd}$ wafer. After that, a $2^{nd}$ wafer is attached to the first wafer by bonding the first and second oxide layers together, cumulatively illustrated and referred to as the bonding oxide layer 110. According to an exemplary embodiment, the bonding process is performed by pressing the first and second oxide layers together, for example face-to-face, at room temperature with a force initiating from a center contacting area. The contacting area will expand from the center outward across the layers. Thereafter, a thermal anneal at about 280 degrees Celsius (° C.) for greater than about 12 hours, e.g., for about 24 hours, is required to enforce the bonding quality. After bonding, the second wafer is typically thinned down to a desired thickness, and fabrication of the top transistor structure continues.

The structure 100 illustrated in FIG. 2 depicts a stacked transistor structure during replacement gate operations for the top transistor structure. Specifically, a top gate dielectric layer 114 and a top work function metal layer 116 (hereinafter "top WFM 116") are conformally deposited within an opening in a dielectric layer 118 according to known replacement gate techniques.

The top gate dielectric layer 114 is composed of any known gate dielectric materials, for example, oxide, nitride, and/or oxynitride. In an example, the top gate dielectric layer 114 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_x$ $N_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure including different gate dielectric materials. For example, a silicon dioxide layer and a high-k gate dielectric layer can be formed and used together as the top gate dielectric layer 114. In at least one embodiment, the top gate dielectric layer 114 is composed of hafnium oxide.

In an embodiment, the top WFM 116 is composed of an n-type work function metal. As used herein, an "n-type work function metal" is a metal that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In an embodiment, the work function of the n-type work function metal ranges from 4.1 eV to 4.3 eV. In an embodiment, the n-type work function metal is composed of at least one of TiAl, TaN, TiN, HfN, HfSi, or combinations thereof. The n-type work function metal can be formed using chemical vapor deposition atomic layer deposition, sputtering or plating.

In another embodiment, the top WFM 116 may be a p-type work function metal. As used herein, a "p-type work function metal" is a metal that effectuates a p-type threshold voltage shift. In an embodiment, the work function of the p-type work function metal ranges from 4.9 eV to 5.2 eV. As used herein, "threshold voltage" is the lowest attainable gate voltage that will turn on a semiconductor device, for example, transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In an embodiment, the p-type work function metal may be composed of titanium, titanium nitride or titanium carbide. The p-type work function metal may also be composed of TiAlN, Ru, Pt, Mo, Co and alloys and combinations thereof.

The dielectric layer 118 can be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0. In another embodiment, a self-planarizing material such as a spin-on glass (SOG) or a spin-on low-k dielectric material such as SiLK™ can be used as the dielectric layer 118. Using a self-planarizing dielectric material as the dielectric layer 118 can avoid the need to perform a subsequent planarizing step.

Figure 3:
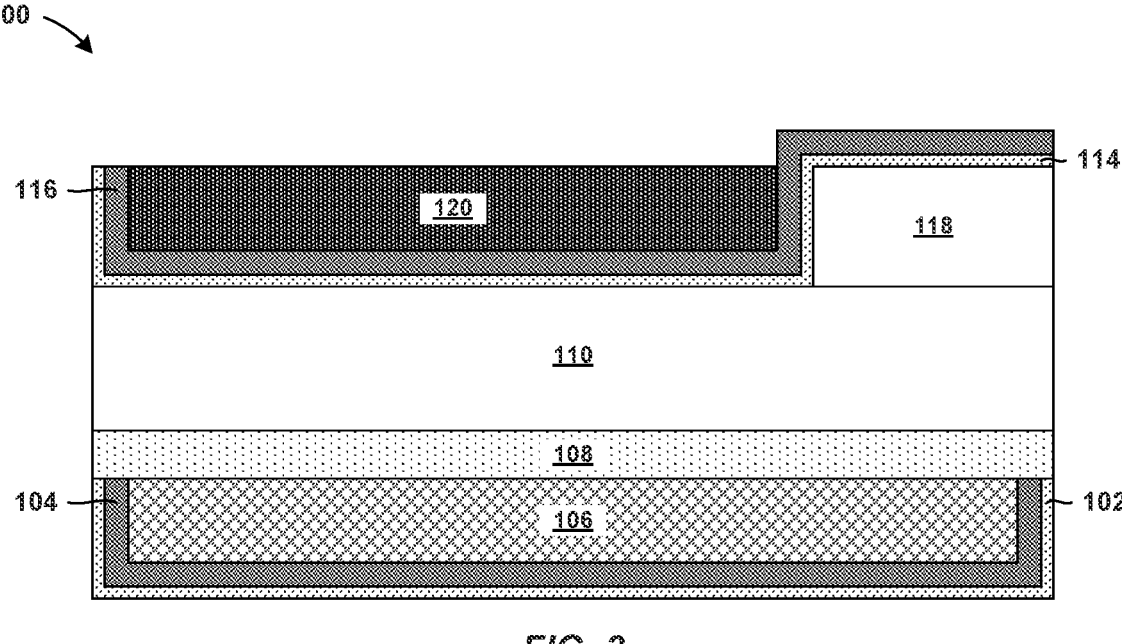
FIG. 3 is a cross-sectional view of the semiconductor structure after forming a mask according to an exemplary embodiment.

Referring now to FIG. 3, a structure 100 is shown after forming a mask 120 according to an embodiment of the invention. FIG. 3 depicts a cross-sectional view of the generic structure shown in FIG. 1 taken along line Y-Y.

The mask 120 is blanket deposited and subsequently patterned to expose certain portions of the structure 100 according to known techniques. Specifically, horizontal portions of the top gate dielectric layer 114 and the top WFM 116 are exposed, while remaining portions remain in the opening.

The mask 120 can be an organic planarization layer (OPL) or a layer of material that is capable of being planarized or etched by known techniques. In an embodiment, for example, the mask 120 can be an amorphous carbon layer able to withstand the high temperatures of subsequent processing steps. The mask 120 can preferably have a thickness sufficient to cover and protect the top gate dielectric layer 114 and the top WFM 116 as illustrated.

Figure 4:
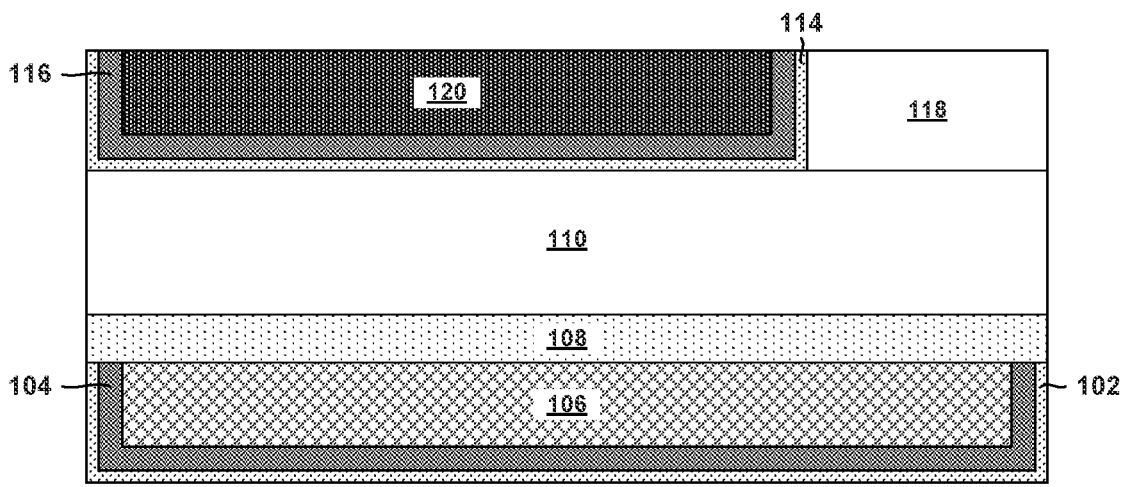
FIG. 4 is a cross-sectional view of the semiconductor structure after removing exposed portions of the top gate dielectric layer and the top work function metal layer according to an exemplary embodiment.

Referring now to FIG. 4, a structure 100 is shown after removing exposed portions of the top gate dielectric layer 114 and the top WFM 116 according to an embodiment of the invention. FIG. 4 depicts a cross-sectional view of the generic structure shown in FIG. 1 taken along line Y-Y.

As shown in FIG. 4, horizontal portions of the top gate dielectric layer 114 and the top WFM 116 are removed according to know techniques. In an embodiment a polishing technique can be use stopping on the dielectric layer 118. In an alternative embodiment, dry or wet etch chemistries may also be used to remove portions of the top gate dielectric layer 114 and the top WFM 116, as illustrated.

Figure 5:
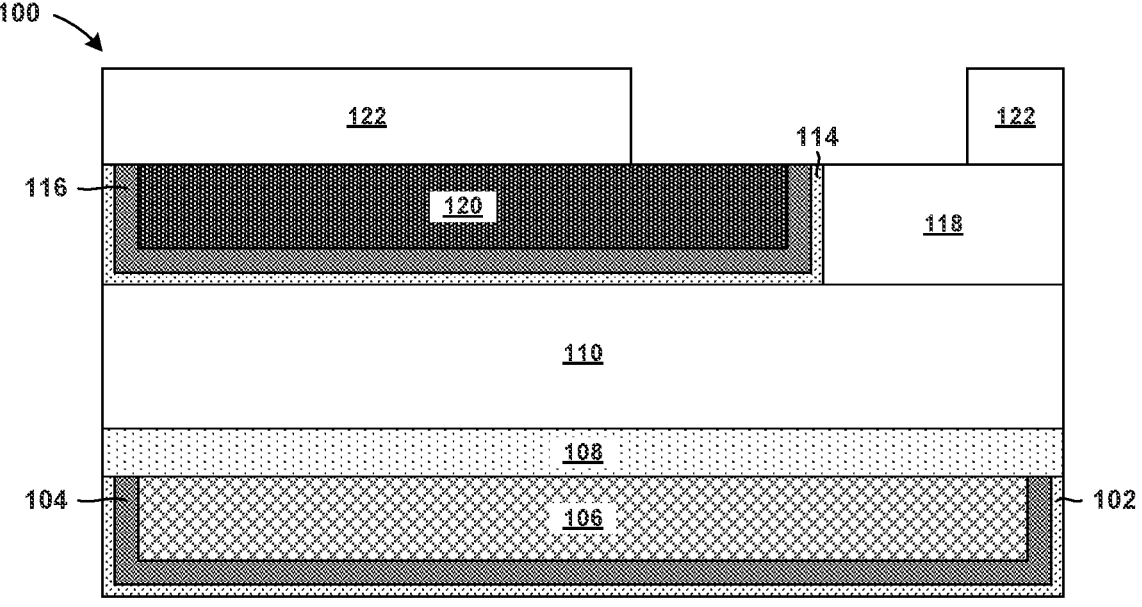
FIG. 5 is a cross-sectional view of the semiconductor structure after forming a contact mask according to an exemplary embodiment.

Referring now to FIG. 5, a structure 100 is shown after forming a contact mask 122 according to an embodiment of the invention. FIG. 5 depicts a cross-sectional view of the generic structure shown in FIG. 1 taken along line Y-Y.

The contact mask 122 is patterned to expose portions of the top gate dielectric layer 114 and the top WFM 116. Additionally, the pattern of the contact mask 122 is also arranged above the bottom gate conductor 106. In all cases, the pattern in the contact mask 122 must overlap both the bottom gate structure and the top gate structure, as illustrated. The contact mask 122 defines a region of the structure 100 for a common gate contact, as described in further detail below.

Figure 6:
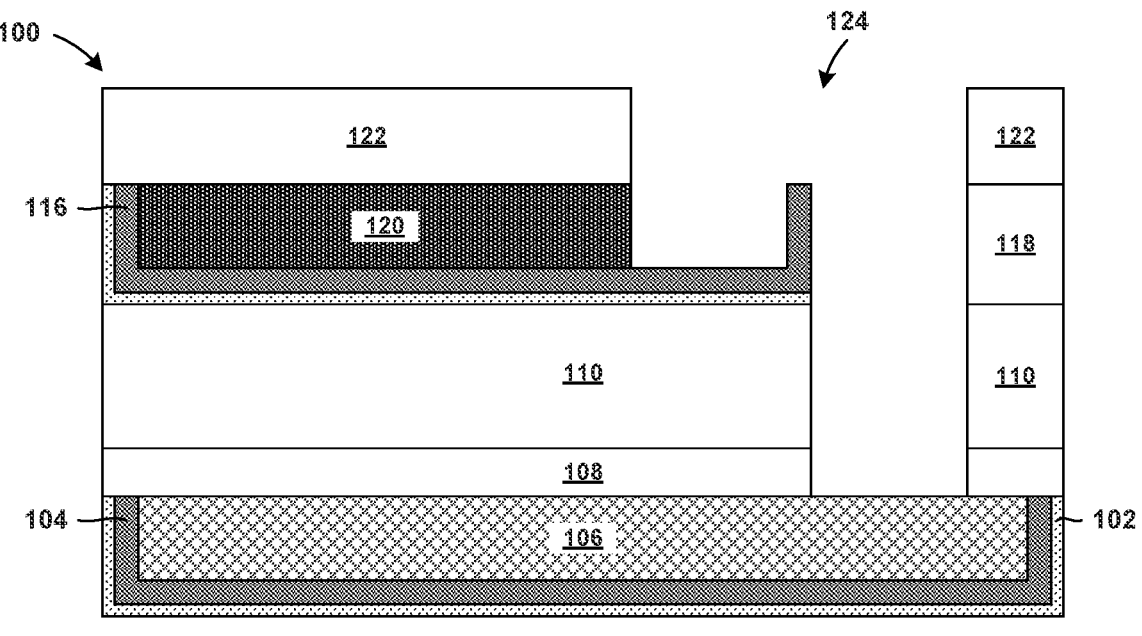
FIG. 6 is a cross-sectional view of the semiconductor structure after forming a trench according to an exemplary embodiment.

Referring now to FIG. 6, a structure 100 is shown after forming a trench 124 according to an embodiment of the invention. FIG. 6 depicts a cross-sectional view of the generic structure shown in FIG. 1 taken along line Y-Y.

The pattern in the contact mask 122 is transferred into underlying layers to form the trench 124. In doing do, portions of the mask 120, the dielectric layer 118, the bonding oxide layer 110, and the MOL dielectric 108 are selectively removed according to known techniques. For example, the selective removal of the above portions may be accomplished by using any known etching technique suitable to remove dielectrics selective to metals. In all cases etching continues until an uppermost surface of the bottom gate conductor 106 is exposed. It is noted, the trench 124, due to its position, will have a shallow portion exposing an uppermost surface of the top WFM 116 and a deep portion exposing an uppermost surface of the bottom gate conductor 106. It is further noted, a side portion of the top gate dielectric layer 114 is removed without removing a side portion of the top WFM 116, as illustrated.

In an embodiment, for example, a reactive ion etching using a fluorine chemistry can be used to selectively remove the portions of the dielectric layer 118, bonding oxide layer 110, and MOL dielectric 108, and a reactive ion etching using CHF3/CF4 chemistry can first be used to selectively remove the portions of the mask 120.

Figure 7:
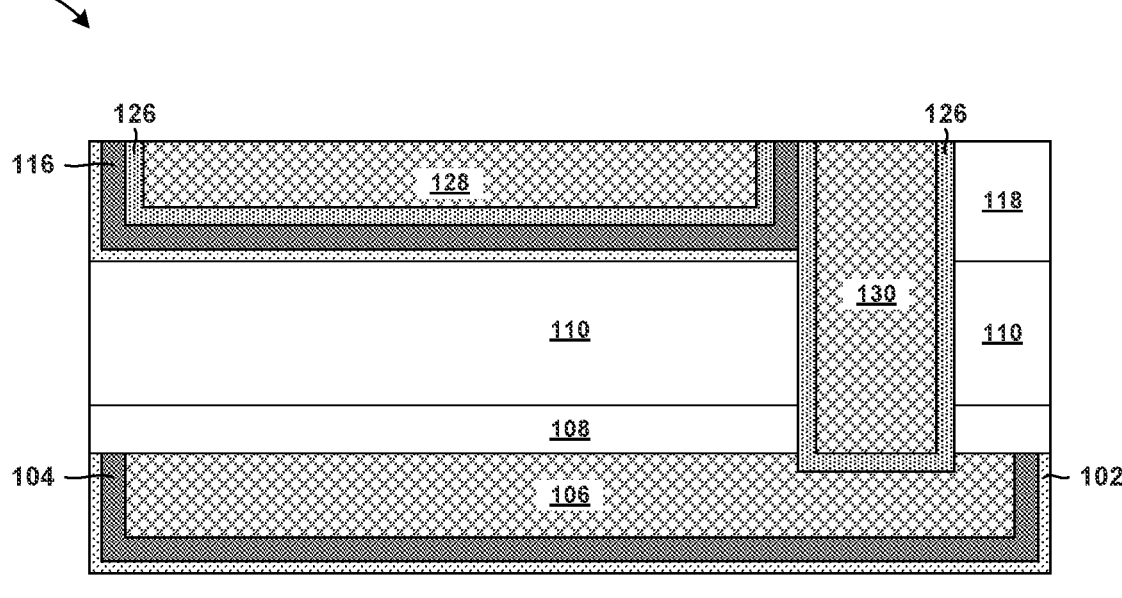
FIG. 7 is a cross-sectional view of the semiconductor structure after removing both the contact mask and the mask, and forming a barrier layer followed by a top gate conductor and a self-aligned gate contact according to an exemplary embodiment.

Referring now to FIG. 7, a structure 100 is shown after removing both the contact mask 122 and the mask 120, and forming a barrier layer 126 followed by a top gate conductor 128 and a self-aligned gate contact 130 according to an embodiment of the invention. FIG. 7 depicts a cross-sectional view of the generic structure shown in FIG. 1 taken along line Y-Y.

First, the contact mask 122 and the mask 120 are removed using known techniques. After removing the mask 120, the top WFM 116 is completely exposed and the shallow portion of the trench 124 becomes longer, in the y-direction.

Next, the barrier layer 126 is conformally deposited within the trench 124 according to known techniques. As well known by persons having skill in the art, the barrier layer 126 is required to create a diffusion break between sidewall portions of the dielectric layer 118, the bonding oxide layer 110, and the MOL dielectric 108. The barrier layer 126 must prevent diffusion of any subsequently deposited conductive material into the surrounding dielectrics (118, 110, 108).

In an embodiment, the barrier layer 126 is conformally deposited directly on the top WFM 116 in the shallow portion of the trench 124, albeit unnecessary and duplicative.

According to embodiments of the present invention the barrier layer 126 is composed of any known suitable barrier materials, for example, metal nitrides. In a primary embodiment, the barrier layer 126 is TiN of a sufficient thickness. In an alternative embodiment, the barrier layer 126 is TiN, Boron Carbon doped Tungsten (WBC), Ru or TaN. In yet another embodiment, the barrier layer 126 could be Ta, TaN or some combination thereof.

Finally, typical replacement gate operations resume and the trench 124 is filled with a conductive material to form the top gate conductor 128 and the self-aligned gate contact 130 according to known techniques. The conductive material may include any suitable conductive material, such as, for example, copper, ruthenium, aluminum, tungsten, cobalt, or alloys thereof. In a preferred embodiment, the conductive material is tungsten. After, excess conductive material can be polished using known techniques until topmost surfaces of the top gate conductor 128 and the self-aligned gate contact 130 are flush, or substantially flush, with topmost surfaces of the dielectric layer 118. In doing so, polishing removes excess portions of the barrier layer 126 such that an uppermost surface of the barrier layer 126 is also flush, or substantially flush, with topmost surfaces of the dielectric layer 118, as illustrated.

As illustrated in FIG. 7, the stacked transistor structures represented by the structure 100 has some distinctive notable features. For purposes of this description the structure 100 illustrated in the figures and described herein represents a single stacked transistor structure manufactured using a replacement metal gate process flow. It is noted the structure 100 is a simplified structure illustrating the novel features of the present invention. A more comprehensive example is described below with respect to FIGS. 8 and 9.

In sum, the structure 100 and associated process flow enable manufacturing of stacked transistor devices with a common gate contact. Even more specifically, the self-aligned gate contact 130 is a single contact which provides an electrical connection to both the bottom gate conductor 106 and the top gate conductor 128. This is accomplished by fabricating the common gate contact (130) using a self-aligned process.

Further, since the top gate structure and the self-aligned contact are finished together, a portion of the barrier layer 126 in the top gate structure and a portion of the barrier layer 126 in the self-aligned contact are made from identical materials. Similarly, the conductive material used form the top gate conductor 128 and the self-aligned gate contact 130 will also be the same.

A discoverable signature of the self-align techniques used to fabricate the common gate contact (130) includes the presence of the barrier layer 126 between the top WFM 116 and the top gate conductor 128. It is further noted, the barrier layer 126 is not present anywhere in the bottom gate structure. Additionally, the physical connection between the top gate conductor 128 and the self-aligned gate contact 130 only includes vertical portions of the barrier layer 126 and the top WFM 116, as illustrated. As a result of the self-aligned techniques described herein, no vertical portion of the top gate dielectric layer 114 exists between the top gate conductor 128 and the self-aligned gate contact 130, as illustrated.

Figure 8:
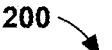
FIGS. 8 and 9 are cross-sectional views of a semiconductor structure during an intermediate step of a method of fabricating a stacked transistor structure according to an exemplary embodiment.
Figure 9:
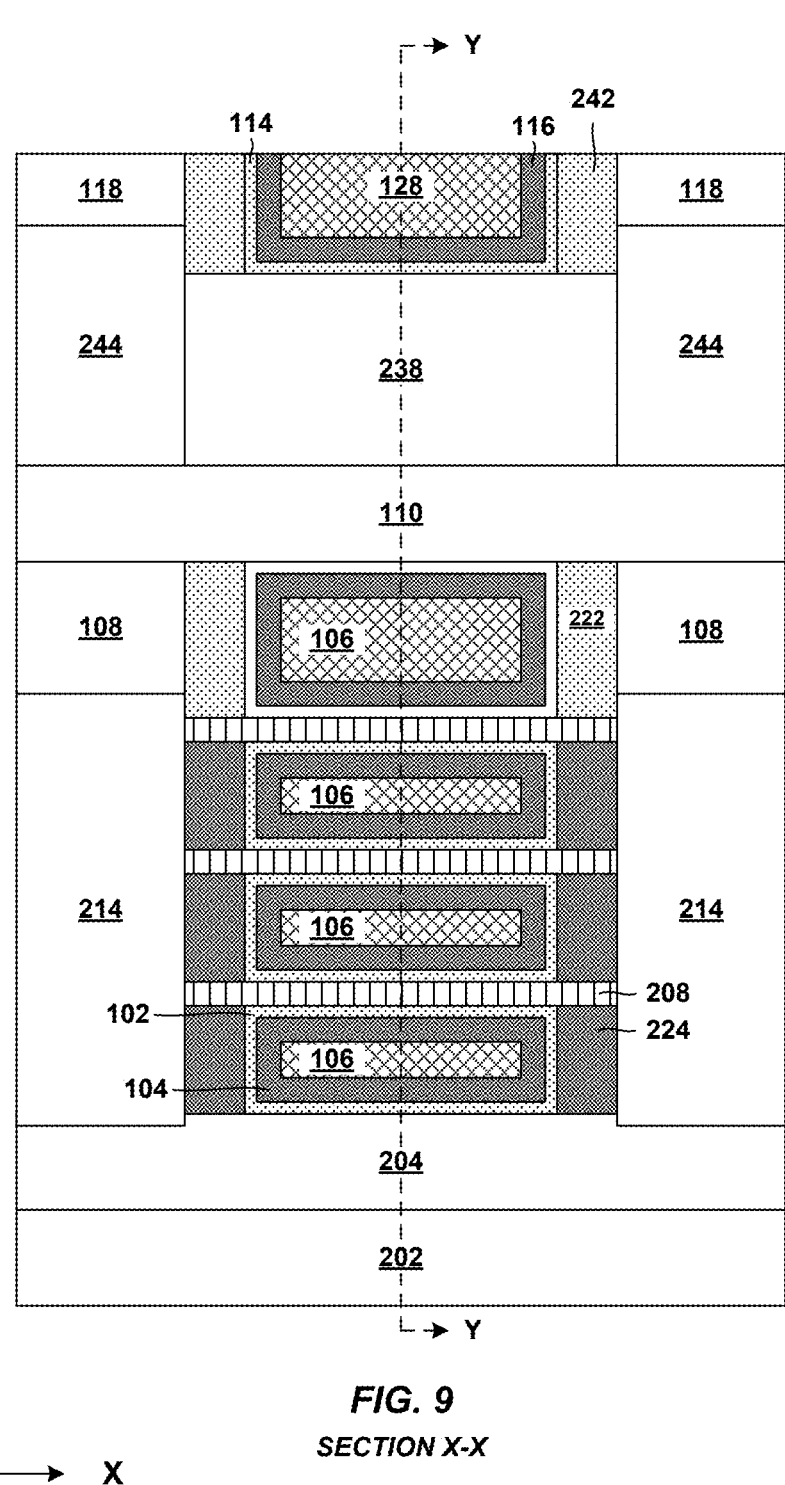

Referring now to FIGS. 8 and 9, a structure 200 is shown during an intermediate step of a method of fabricating a stacked transistor structure according to an embodiment of the invention. FIG. 8 depicts a cross-sectional view of the generic structure shown in FIG. 1 taken along line Y-Y. FIG. 9 depicts a cross-sectional view of the generic structure shown in FIG. 1 taken along line X-X.

The structure 200 illustrated in FIGS. 8 and 9 represents an exemplary stacked transistor structure formed on an oxide isolation layer 204, which is formed on a silicon substrate 202 in accordance with known techniques. The structure 200 is an exemplary transistor structure having the inventive features described above with respect to the structure 100. As illustrated, the structure 200 includes a bottom nanosheet device 206. The bottom nanosheet device 206 includes silicon channels 208 surrounded by the bottom gate dielectric layer 102, the bottom WFM 104, and the bottom gate conductor 106.

Additionally, bottom source drain regions 214 are formed between adjacent devices (not shown) in direct contact with exposed ends of the silicon channels 208. More specifically, the bottom source drain regions 214 are epitaxially grown from the exposed ends of the silicon channels 208 according to known techniques.

The bottom nanosheet device 206 further includes inner spacers 224 between the silicon channels (208). The inner spacers 224 laterally separate the bottom gate conductor 106 from both the bottom source drain regions 214, as illustrated. The inner spacers 224 provide necessary electrical insulation between the bottom gate conductor 106 and the bottom source drain regions 214. As part of typical replacement gate processing, bottom gate spacers 222 are formed. When forming the bottom gate conductor 106, the bottom gate spacers 222 are added to separate and electrically insulate the bottom gate conductor 106 from subsequently formed structures, such as, for example, contact structures.

The structure 200 further includes a top fin device 218 is formed above the bottom nanosheet device 206 after bonding two wafers together using the bonding oxide layer 110 according to known oxide bonding techniques. After bonding, fins 238 are formed from the substrate of the bonded wafer according to known techniques. The fins 238 will form the channel regions of the top fin device 218 in a stacked transistor configuration as described herein.

The fins 238 of the top fin device 218 are surrounded by the top gate dielectric layer 114, the top WFM 116, and the top gate conductor 128. Additionally, top source drain regions 244 are formed between adjacent devices (not shown) in direct contact with exposed ends of the fins 238. More specifically, the top source drain regions 244 are epitaxially grown from the exposed ends of the fins 238 according to known techniques. A dielectric layer 118 substantially surrounds the top fin device 218 in a typical fashion.

As part of typical replacement gate processing, top gate spacers 242 are formed. When forming the top gate conductor 128, the top gate spacers 242 are added to separate and electrically insulate the top gate conductor 128 from subsequently formed structures, such as, for example, contact structures.

Finally, the structure 200 shares the same notable features as described above with respect to the structure 100.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A stacked semiconductor structure comprising:
   a top transistor stacked above a bottom transistor;

a single gate contact in electrical contact with a top gate conductor of the top transistor and a bottom gate conductor of the bottom transistor.

2. The semiconductor structure according to claim 1, wherein an uppermost surface of the top gate conductor is substantially flush with an uppermost surface of the single gate contact.

3. The semiconductor structure according to claim 1, wherein the top gate conductor and the single gate contact are only separated by a first barrier layer, a top work function metal layer, and a second barrier layer.

4. The semiconductor structure according to claim 1, further comprising:

a first barrier layer beneath the top gate conductor and above a top work function metal layer; and a second barrier layer beneath the single gate conductor, wherein first barrier layer and the second barrier layer are made from identical materials.

5. The semiconductor structure according to claim 4, wherein a sidewall of the top work function metal layer directly contacts a sidewall of the second barrier layer.

6. The semiconductor structure according to claim 1, further comprising:

a bonding oxide layer separating the bottom transistor from the top transistor, wherein the single gate contact extends through the bonding oxide layer.

7. The semiconductor structure according to claim 1, wherein the top transistor is a fin device and the bottom transistor is a nanosheet device.

8. A stacked semiconductor structure comprising:

a top transistor stacked above a bottom transistor;

a single gate contact in electrical contact with a top gate conductor of the top transistor and a bottom gate conductor of the bottom transistor, wherein the single gate contact is self-aligned to the top gate conductor.

9. The semiconductor structure according to claim 8, wherein an uppermost surface of the top gate conductor is substantially flush with an uppermost surface of the single gate contact.

10. The semiconductor structure according to claim 8, wherein the top gate conductor and the single gate contact are only separated by a first barrier layer, a top work function metal layer, and a second barrier layer.

11. The semiconductor structure according to claim 8, further comprising:

a first barrier layer beneath the top gate conductor and above a top work function metal layer; and a second barrier layer beneath the single gate conductor, wherein first barrier layer and the second barrier layer are made from identical materials.

12. The semiconductor structure according to claim 11, wherein a sidewall of the top work function metal layer directly contacts a sidewall of the second barrier layer.

13. The semiconductor structure according to claim 8, further comprising:

a bonding oxide layer separating the bottom transistor from the top transistor, wherein the single gate contact extends through the bonding oxide layer.

14. The semiconductor structure according to claim 8, wherein the top transistor is a fin device and the bottom transistor is a nanosheet device.

15. A stacked semiconductor structure comprising:

a top transistor stacked above a bottom transistor;

a single gate contact in electrical contact with a top gate conductor of the top transistor and a bottom gate conductor of the bottom transistor, wherein the top gate conductor and the single gate contact comprise the same conductive material.

16. The semiconductor structure according to claim 15, wherein an uppermost surface of the top gate conductor is substantially flush with an uppermost surface of the single gate contact.

17. The semiconductor structure according to claim 15, wherein the top gate conductor and the single gate contact are only separated by a first barrier layer, a top work function metal layer, and a second barrier layer.

18. The semiconductor structure according to claim 15, further comprising:

a first barrier layer beneath the top gate conductor and above a top work function metal layer; and a second barrier layer beneath the single gate conductor, wherein first barrier layer and the second barrier layer are made from identical materials.

19. The semiconductor structure according to claim 18, wherein a sidewall of the top work function metal layer directly contacts a sidewall of the second barrier layer.

20. The semiconductor structure according to claim 15, further comprising:

a bonding oxide layer separating the bottom transistor from the top transistor, wherein the single gate contact extends through the bonding oxide layer.

* * * * *